US 8,288,800 B2

(12) United States Patent
Zhu et al.

(10) Patent No.: US 8,288,800 B2
(45) Date of Patent: Oct. 16, 2012

(54) HYBRID TRANSISTOR

(75) Inventors: Ming Zhu, Singapore (SG); Chun Shan Yin, Singapore (SG); Elgin Quek, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 363 days.

(21) Appl. No.: 12/651,487

(22) Filed: Jan. 4, 2010

(65) Prior Publication Data

US 2011/0163356 A1    Jul. 7, 2011

(51) Int. Cl.
*H01L 29/66* (2006.01)

(52) U.S. Cl. .......... 257/261; 257/350; 257/E21.687; 438/216; 438/593

(58) Field of Classification Search .......... None
See application file for complete search history.

(56) References Cited

U.S. PATENT DOCUMENTS

2008/0157201 A1*  7/2008  Marshall .......... 257/350
2008/0304305 A1*  12/2008  Chang et al. .......... 363/147

* cited by examiner

*Primary Examiner* — Benjamin Sandvik
*Assistant Examiner* — Scott R Wilson
(74) *Attorney, Agent, or Firm* — Horizon IP Pte Ltd

(57) ABSTRACT

A method of forming a device is disclosed. The method includes providing a substrate having an active area. A gate is formed on the substrate. First and second current paths through the gate are formed. The first current path serves a first purpose and the second current path serves a second purpose. The gate controls selection of the current paths.

30 Claims, 16 Drawing Sheets

(i)

(ii)

(i)

(ii)

HYBRID TRANSISTOR

BACKGROUND

Non-volatile memory (NVM) has been widely used as computer memory that can retain the stored information even when there is no power supply. Examples of non-volatile memory include read-only memory, flash memory, and most types of magnetic computer storage devices. Programming in NVM is achieved by applying a positive programming voltage to the drain region and connecting the source region to ground, thereby charging the floating gate (FG) via channel hot electron (CHE) injection from the drain region. Therefore, the hot carrier injection efficiency determines the program speed of the memory device.

To achieve efficient hot carrier injection, high lateral and vertical electric fields are desired to cause impact ionization and attract electrons to the gate respectively. Impact ionization is a phenomenon where an energetic charge carrier loses energy by the creation of other charge carriers. In particular, in semiconductors, an electron (or hole) with enough kinetic energy can transfer its energy to an electron in the valence band, and promote it to the conduction band, hence creating an electron-hole pair. However, in a conventional metal-oxide-semiconductor field-effect transistor (MOSFET) for example, when the gate voltage is increased, the vertical electric field increases whereas the lateral electric field decreases. As a result, the MOS device has low injection efficiency.

From the foregoing discussion, it is understood that challenges exist to achieve high hot carrier injection efficiency with low power for a fast programming memory device.

SUMMARY

A hybrid transistor is presented. The transistor comprises a gate. It also includes first and second current paths through the gate. The first current path serves a first purpose and the second current path serves a second purpose. The current paths are selected by providing an appropriate signal at the gate.

A method of forming a device is also disclosed. The method includes providing a substrate having an active area. A gate is formed on the substrate. First and second current paths through the gate are formed. The first current path serves a first purpose and the second current path serves a second purpose. The gate controls selection of the current paths.

In yet another embodiment, a method of forming an integrated circuit is also presented. The method includes providing a substrate having an active area. A gate is formed on the substrate. First and second current paths through the gate are also formed. The first current path serves a first purpose and the second current path serves a second purpose. The gate controls selection of the current paths.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs).

Figure 1:
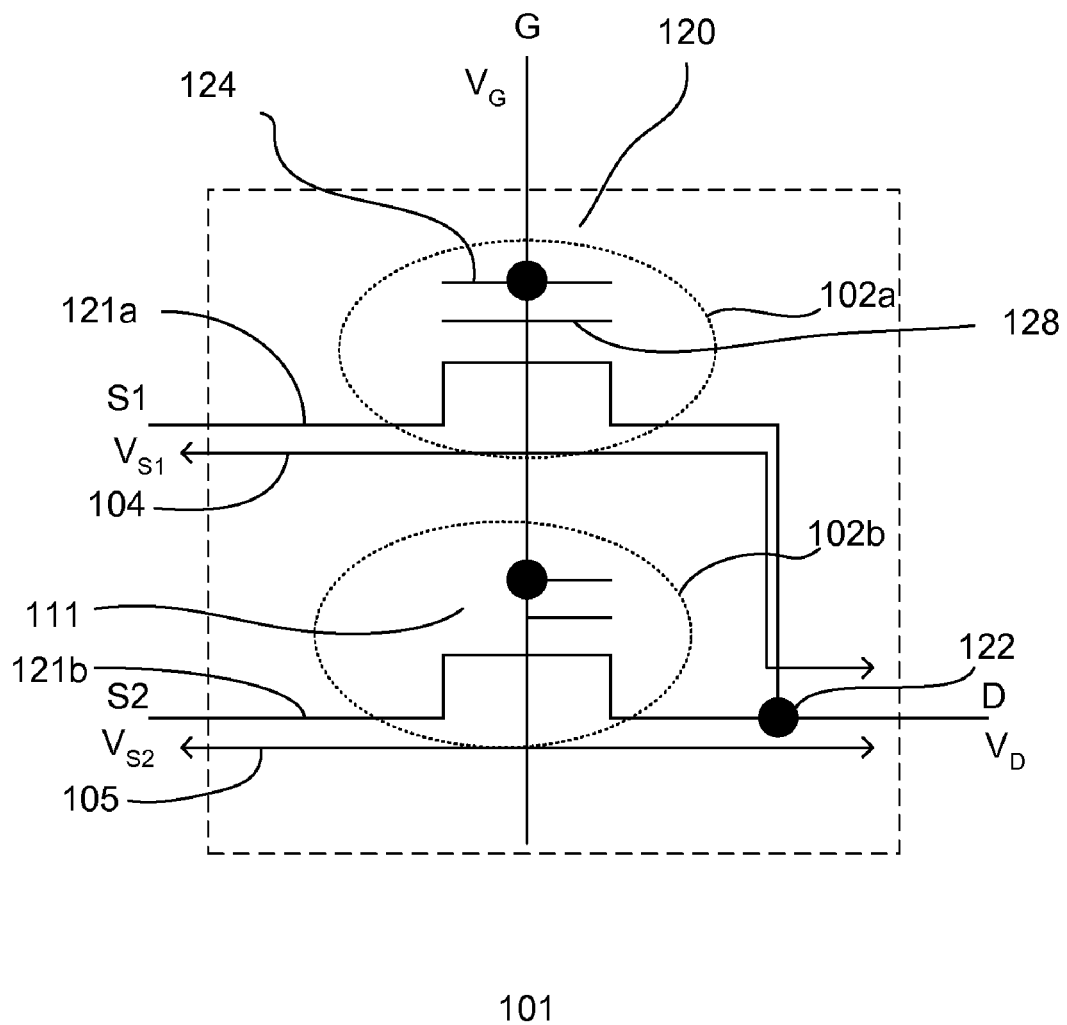
FIG. 1 shows an embodiment of a circuit schematic diagram of a memory cell.

FIG. 1 shows a circuit schematic diagram of a hybrid transistor 101. The transistor, as shown, uses a hot carrier injection mechanism. For example, the transistor comprises a floating gate transistor with a hot carrier injection mechanism. The floating gate, in one embodiment, comprises a conductive floating gate. Other types of transistors, such as a split gate transistor, may also be used. The transistor, for example, forms a NVM memory cell. Employing the transistor for other applications may also be useful.

The transistor comprises a gate 120. As shown, the gate comprises first and second sub-gates 124 and 128. For example, the first sub-gate 124 serves as a control gate and the second sub-gate 128 serves as a floating gate. Adjacent to a first side of the gate are first and second source regions 121a-b; adjacent to a second side of the gate is a drain 122. In one embodiment, an ionization region 111 is disposed between the second source region and the gate. First and second terminals S1 and S2 are coupled to first and second source regions while a third terminal D is coupled to the drain and a fourth terminal G is coupled to the gate. The first terminal S1 is a first source terminal, the second terminal S2 is a second source terminal, the third terminal D is a drain terminal and the fourth terminal G is a gate terminal, forming a four-terminal transistor.

In alternative embodiment, the transistor may include first and second non-common drains D1 and D2 on the second side of the gate to from a five terminal transistor. This produces a five terminal transistor.

A first current path 104 is formed through the first source terminal, gate and the drain terminal while a second current path 105 is formed through the second source terminal, gate and the drain terminal. Selection of the current paths can be achieved with, for example, applying the appropriate signal to the gate terminal. The current paths can serve different purposes to enhance performance. In one embodiment, the first current path includes a first sub-transistor 102a or has the effect of a first type transistor tailored for the first purpose and the second current path includes a second sub-transistor 102b or has the effect of a second type transistor tailored for the second purpose. The sub-transistors have a common gate. The current paths, for example, correspond to different access paths of the memory cell. In one embodiment, one of the current paths is used for programming the memory cell, such as writing or erasing and the other current path is used for reading the memory cell. For example, the first current path can be used for reading while the second current path can be used for programming.

In one embodiment, the first sub-transistor comprises or has the effect of a transistor having source and drain comprising dopants of the same polarity type, such as a metal oxide semiconductor (MOS) transistor and the second sub-transistor comprises an impact ionization transistor (I-transistor), such as an impact ionization MOS (I-MOS) transistor having source and drain comprising dopants of the opposite polarity types. For example, the first sub-transistor comprises n-doped source and drain regions and the second sub-transistor comprise a p-doped source region and an n-doped drain region. Other configurations, such as p-doped source and drain regions for the first sub-transistor and an n-doped source region and p-doped drain region for the second sub-transistor, are also useful.

The I-transistor is essentially a P-I-N diode comprising an intrinsic region (I-region) 111 between the P and N doped regions. The intrinsic region is disposed, for example, adjacent to the source and gate of the I-MOS transistor. During programming, a strong lateral electric field is generated in the intrinsic region by reverse biasing the diode part to achieve strong impact ionization. The lateral electric field can be further increased by applying a polarization on the gate ($V_G>0, V_{S2}<0$), pushing the I-transistor into avalanche breakdown mode. As a result, high density of hot carriers can be generated rapidly in the intrinsic region due to the strong impact ionization and sharp sub-threshold slope of the I-transistor. In addition, due to the self-amplifying avalanche effect, the hot carrier injection efficiency is greatly enhanced. This increases programming speed.

Various voltages are applied to the terminals S1, S2, D and G. A transistor is off when $V_G<V_T$ and on when $V_G>V_T$. In the programming mode, both the first and second transistors might be switched on since $V_G>V_T$. However, for the first transistor, there is no current flow in the channel due to the potentials of both source and drain being the same. On the other hand, in the reading mode, the first transistor is switched on and the second transistor is switched off.

Table 1 below shows an embodiment of voltages at the different terminals for different operating modes of the memory cell. Other voltages may also be useful for different operating modes.

TABLE 1

| Terminals | Mode | | |
| --- | --- | --- | --- |
| | Program Voltages | Erase Voltages | Read Voltages |
| $V_{S2}$ | −5 | 0 | 0 |
| $V_{S1}$ | 1 | 0 | 0 |
| $V_D$ | 1 | 0 | 1 |
| $V_G$ | 9 | 14 | 1.2 |

As described, the memory cell comprises a hybrid transistor. Programming or erasing is achieved using one of the sub-transistors while reading is achieved using the other sub-transistor. In one embodiment, programming or erasing is achieved using the second sub-transistor and reading is achieved using the first sub-transistor.

In accordance with one embodiment, programming entails writing a 1 to the memory cell; erasing entails writing a 0 to the memory cell. Alternatively, programming can be writing a 0 to the memory cell while erasing writes a 1 to the memory cell. During programming or erasing, the second sub-transistor is on and the first sub-transistor is off. To program, for example, an n-type memory cell, the high positive gate voltage attracts the hot electrons generated by impact ionization in the I-region and the negative gate voltage triggers impact ionization into the floating gate. Due to impact ionization, increased programming speed is achieved.

During reading, since the gate voltage is higher than the gate threshold voltage of the first sub-transistor, the first sub-transistor is switched on. On the other hand, the gate voltage is lower than the threshold voltage of the second sub-transistor (I-transistor), causing it to be switched off. The drain current of the first sub-transistor is the read current to indicate whether there is charge stored in the gate, corresponding to either a 1 or a 0 stored. As such, no impact ionization occurs in the memory cell while reading. This reduces read disturb and improves reliability of the memory cell. On the other hand, during programming, the second sub-transistor is used, which increases programming speed.

A plurality of memory cells may be interconnected to form an array. For example, the memory cells may be interconnected by wordlines in a first direction and bitlines in a second direction. In one embodiment, a drain of a memory cell is coupled to a bitline of the array and the control gate is coupled to a wordline. The first source is coupled to a read line and the second source is coupled to a program line.

Figure 2A:
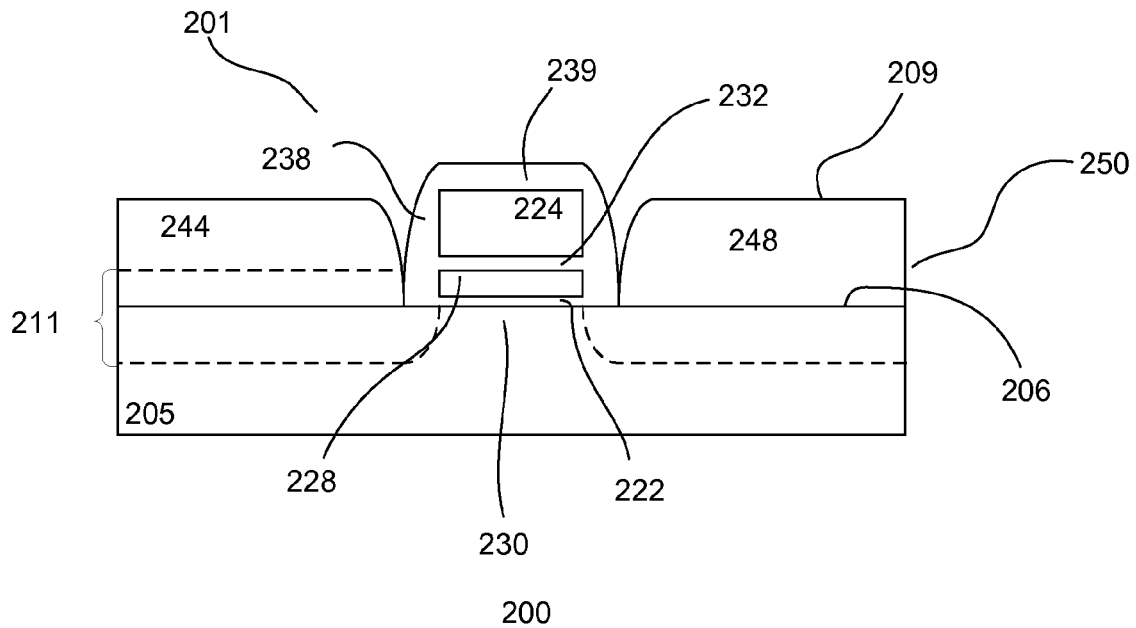
FIGS. 2a-b show cross-sectional and top views of an embodiment of a device.
Figure 2B:
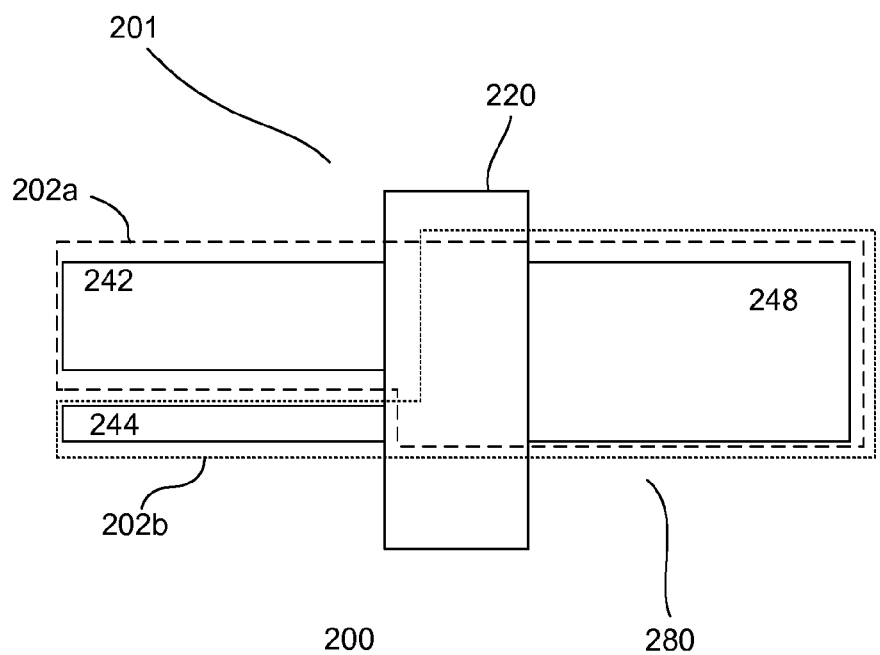

FIGS. 2a-b show cross-sectional and top views of an embodiment of a portion 200 of a device. The portion comprises a hybrid transistor 201, such as one described in FIG. 1. The cross-sectional view of the device is taken from the I-transistor side of the transistor. Referring to FIGS. 2a-b, the transistor is formed on an active region defined on a substrate 205. The substrate, for example, comprises a silicon substrate. The substrate can be lightly doped with p-type dopants. N-type or other types of substrates, such as silicon germanium or silicon-on-insulator (SOI), are also useful. The active region, in one embodiment, comprises a doped well. In one embodiment, the active region comprises a lightly doped well. Other types of doped wells may also be useful. The doped well, for example, comprises first polarity type dopants. In one embodiment, the first polarity type comprises p-type for n-type transistors. Alternatively, the first polarity type comprises n-type for p-type transistors. N-type dopants can include phosphorus (P), arsenic (As), antimony (Sb) or a combination thereof while P-type dopants can include boron (B), indium (In) or a combination thereof. Isolation regions (not shown), such as shallow trench isolation regions, may be provided to isolate the active region from other device regions.

The hybrid transistor comprises a gate 220. In one embodiment, the gate comprises first and second stacked sub-gate electrodes 224 and 228. The first sub-gate electrode, for example, serves as a control gate over the second sub-gate electrode which serves as a floating gate. Other gate configurations are also useful. Various types of materials, such as polysilicon, can be used to form the gate electrodes. Beneath the gate is a channel region 230.

A dielectric layer 222 is provided to separate the second sub-gate electrode from the substrate and an inter-gate dielectric layer 232 is disposed between the sub-gate electrodes. The dielectric layers, for example, comprise silicon oxide. Employing other types of dielectric materials, such as $Al_2O_3$ or $HfO_2$, is also useful. Dielectric cap 239 and sidewall spacers 238 can be provided for the gate. Various dielectric materials including silicon oxide, silicon nitride, silicon oxynitride, may be used to form the cap and spacers. Additionally, the spacers may be a spacer stack of a plurality of sub-spacers. It is understood that the cap, spacers and sub-spacers need not be formed from the same type of material.

First and second doped regions 242 and 244 are disposed on a first side of the gate while a third doped region 248 is disposed on a second and opposing side. The first and second doped regions serve as the first and second source regions and the third doped region serves as the drain region of the transistor. As shown, the first doped region is wider than the second doped region. The second doped region may be narrower without negatively impacting performance since high injection efficiency can be achieved due to impact ionization. The ability to use a narrower second doped region without negatively impacting performance advantageously reduces the footprint of the transistor. Providing other configurations of first and second doped regions may also be useful.

In one embodiment, at least the second doped region comprises an elevated doped region. An I-region 211 is disposed between the elevated second doped region and the gate. The I-region separates the second doped region from the gate. In other embodiments, elevated doped regions are also provided for the first and third doped regions to form symmetrical structures. Raised regions 250 are disposed on the substrate adjacent to the gate to accommodate the elevated doped region. The raised regions have a top surface 209 above the top surface 206 of the substrate. As shown, the raised regions are isolated from the gate by the sidewall spacers. The raised regions comprise crystalline regions. In one embodiment, the raised regions comprise silicon or silicon germanium. Other types of crystalline material, for examples, material with narrow band-gap, such as Sn and InAs, may also be useful.

In one embodiment, the first doped region (first source), gate and third doped (drain) region form a first sub-transistor. The doped regions of the first sub-transistor comprise dopants of the second polarity type for forming a second polarity type memory cell. For the second polarity type, it can be n-type to form an n-type memory cell. Alternatively, the second polarity type can be p-type to form a p-type memory cell. The dopant concentration of the doped regions is about 1E21 ions/cm$^2$.

The doped regions of the first sub-transistor occupy the raised regions, with extension regions in the substrate below. The extension regions are disposed below the raised regions and extend into the channel region below the spacers to about the edge of the gate electrodes. The depth of the extension regions, for example, is about 50 nm. The extension region comprises a dopant concentration of about 1E21 ions/cm$^2$. In one embodiment, the portion of the extension region below the raised region can have a higher dopant concentration than the portion below the spacer. For example, the dopant concentration of the extension region below the raised region can be about the same as the doped region above.

The second doped region (second source), gate and third doped region (drain) form a second sub-transistor. In one embodiment, the second source region comprises different polarity type dopants than the first source region and the drain region. For example, the second source region comprises first polarity type dopants while the drain region comprises second polarity type dopants. The first polarity type can be p-type and the second polarity type can be n-type.

Disposed between the second source and the gate is an I-region 211. The I-region is a region without any significant dopant species present. For example, the I-region can be undoped or comprises dopants of the substrate type and in an amount of the substrate type. The I-region, in one embodiment, comprises an elevated I-region. The elevated I-region is disposed in a lower portion of the raised region corresponding to the second source and the substrate beneath and extends below the spacer. The second source, in such case, occupies the upper portion of the substrate. Other configurations of source and I-region are also useful. In some embodiments, a non-elevated I-region is used. For example, raised regions are not provided for the transistor.

The distance between the gate and source is equal to a length of the I-region. The length of the I-region should be sufficient to enable avalanche breakdown in the I-region. For example, the length of the I-region is about 20 to 100 nm. Other lengths are also useful. For applications having an elevated I-region, its length may comprise the sum of two parts. The first part is the depth of the portion of the I-region in the elevated region and the second part is the length of the portion of the I-region below the spacer. The first part, for example, may be about 20 nm while the second part may be about 40 nm. This produces an I-region having a length of about 60 nm. Providing an I-region having other lengths may also be useful.

Figure 3A:
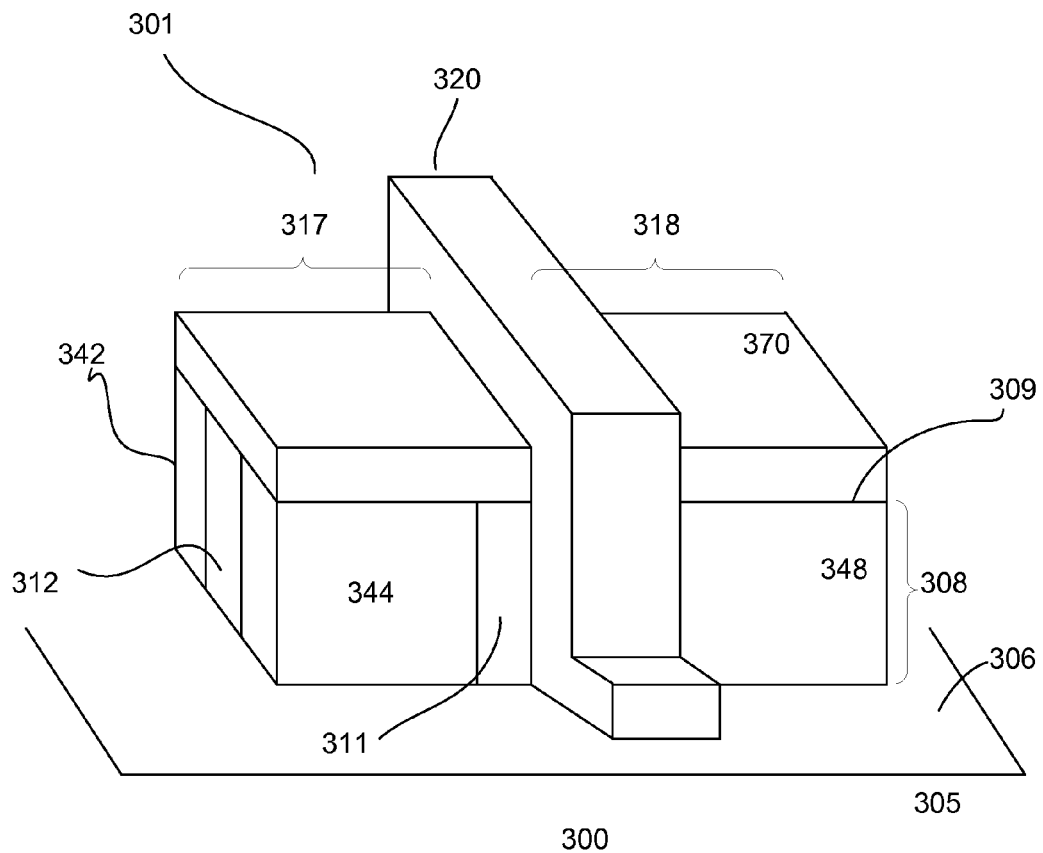
FIGS. 3a-b show cross-sectional and top views of another embodiment of a device.
Figure 3B:
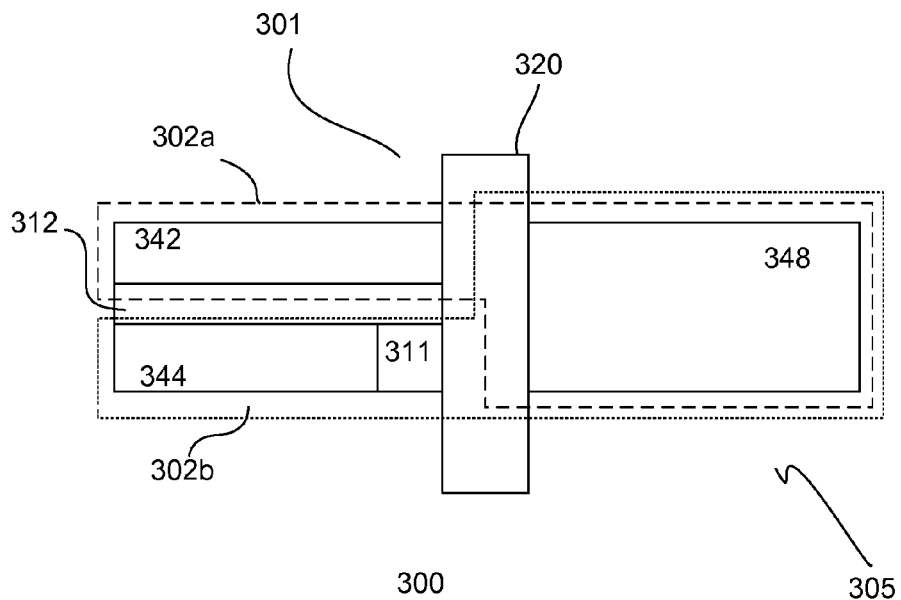

FIGS. 3a-b show 3-dimensional and top views of another embodiment of a portion 300 of a device. The portion comprises a hybrid transistor 301, such as one described in FIG. 1. The transistor is formed on an active region defined on a substrate 305. The substrate, for example, comprises a crystalline-on-insulator (COI) substrate. A COI substrate, for example, includes a bulk crystalline substrate and a surface crystalline layer separated by a buried oxide layer. The COI substrate, in one embodiment, comprises a SOI substrate. A SOI substrate includes a bulk crystalline substrate, such as silicon with a silicon surface layer separated by a buried oxide. Other types of COI substrates, such as a SiGe-on-insulator substrate, may also be used.

In one embodiment, the transistor comprises a fin-type transistor, such as a fin field effect transistor (FinFET). The transistor comprises an elevated body portion 308 disposed on the active region of the substrate. The elevated body portion, in one embodiment, comprises a crystalline region formed from the surface crystalline layer of the COI substrate. The body portion, for example, comprises silicon or silicon germanium. Other types of crystalline material, such as Sn or InAs, may also be useful. The height of the body region, for example, may be about 50 nm. This height may be equal to the thickness of the surface crystalline layer.

A hard mask 370, in one embodiment, is disposed on the top surface of the body portion. The hard mask, for example, comprises silicon oxide. Other types of hard mask materials may also be useful. For example, the hard mask may comprise silicon nitride. Preferably, the hard mask comprises a dielectric material. The hard mask can serve to facilitate the formation of the doped regions.

A gate 320 is disposed over the body region. The gate, for example, wraps around the body portion, separating the body portion into first and second sections 317 and 318. As shown, the gate wraps around about a mid-section of the body portion, forming sections of about the same size. Forming sections having different sizes is also useful. The gate stack can comprise similar types of gate stack as described in FIGS. 2a-b. For example, the gate stack comprises a gate dielectric layer, a floating gate electrode and a control gate electrode separated by a dielectric layer. Providing other types of gate stacks is also useful.

First and second doped regions 342 and 344 are disposed in the first section. In one embodiment, the first and second doped regions are disposed on opposing sides of the body portion in the first section, separated by an undoped mesa region 312. The mesa region, for example, is formed from the crystalline surface layer and serves as an isolation region between the first and second doped region. A third doped region 348 is disposed in the second section. The first and second doped regions serve as source regions and the third doped region serves as a drain region of the transistor. The polarity type of the drain determines the transistor type. For example, n-type drain is used for n-type transistors while p-type drain is used for p-type transistors.

In one embodiment, the first source region, gate and drain region form a first sub-transistor 302a. The doped regions of the first sub-transistor comprise dopants of the second polarity type for forming a second polarity type memory cell. For the second polarity type, it can be n-type to form an n-type memory cell. Alternatively, the second polarity type can be p-type to form a p-type memory cell. The dopant concentration of the doped regions is about 1E21 ions/cm$^2$. Extension regions may be provided for the source and drain regions.

The second source region, gate and drain region form a second sub-transistor 302b. The doped regions (source and drain) of the second sub-transistor comprise dopants of a different polarity type. For example, the second source region comprises dopants of a first polarity while the drain region comprises second polarity type dopants. The first polarity type can be p-type and the second polarity type can be n-type.

Disposed between the second source and the gate is an intrinsic region (I-region) 311. In one embodiment, the I-region comprises an undoped region. Alternatively, the I-region comprises a lightly doped region. For example, the I-region may be lightly doped with n-type or p-type dopant species. In one embodiment, the I-region can be undoped.

Figure 4A:
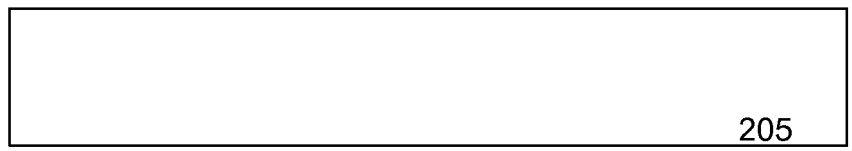
FIGS. 4a-f show cross-sectional and top views of an embodiment of a process for forming a device.
Figure 4A:
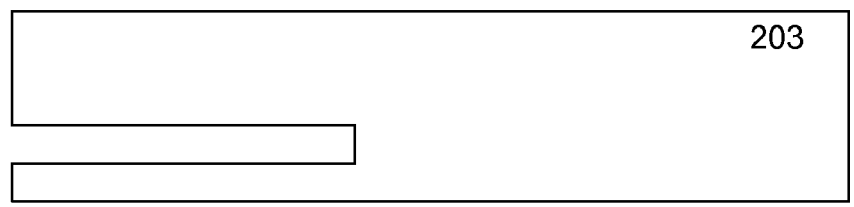

FIGS. 4a-f show cross-sectional (i) and top (ii) views of an embodiment of a process for forming a portion 400 of a device or IC. Referring to FIG. 4a, a substrate 205 is provided. The substrate can comprise a silicon substrate. The substrate, for example, can be a lightly p-type doped substrate. Other types of substrates, including silicon germanium, silicon-on-insulator (SOI) or n-doped substrates, are also useful.

The substrate is prepared with an active region 203. The active region serves as a region on which a transistor is formed. The active region comprises a doped well (not shown) with dopants of a first polarity type. The doped wells may be intermediately or lightly doped wells. The first polarity type doped wells are for second polarity type transistors. The first polarity type can be n-type or p-type, depending on the transistor type. For example, n-type wells are used for p-type transistors while p-type wells are used for n-type transistors. P-type dopants can include boron (B), aluminum (Al), indium (In) or a combination thereof while n-type dopants can include phosphorus (P), arsenic (As), antimony (Sb) or a combination thereof.

The transistor, for example, comprises a transistor as described in FIGS. 1 and 2a-b. In one embodiment, the active region is designed to accommodate the transistor. For example, one side of the active region comprises two separate regions separated by a non-active region. The sub-regions correspond to first and second diffusion regions, such as source regions, of the transistor.

The transistor can be a memory cell in an array region of the device. In one embodiment, the memory cells comprise non-volatile memory cells. Other types of memory cells are also useful. The array region generally comprises a plurality of active regions for a plurality of memory cells.

Additionally, the substrate may include a logic portion (not shown) for support circuitry. The substrate may also include regions for other types of circuitry, depending on the type of device or IC.

Generally, the IC includes regions with both first and second type wells. To form the doped wells, ion implantation techniques, such as implantation with a mask, can be used. The first and second type wells can be formed in separate processes. Other techniques for forming the active regions are also useful. The active region or substrate may be implanted with dopants to define the initial gate threshold voltage ($V_T$).

The substrate can be prepared with isolation regions (not shown), for example, corresponding to non-active regions to separate the active regions from each other and other active device regions. For example, the isolation can surround the active region. In one embodiment, the isolation regions comprise STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of the doped wells. Other processes or materials can also be used to form the STIs.

Figure 4B:
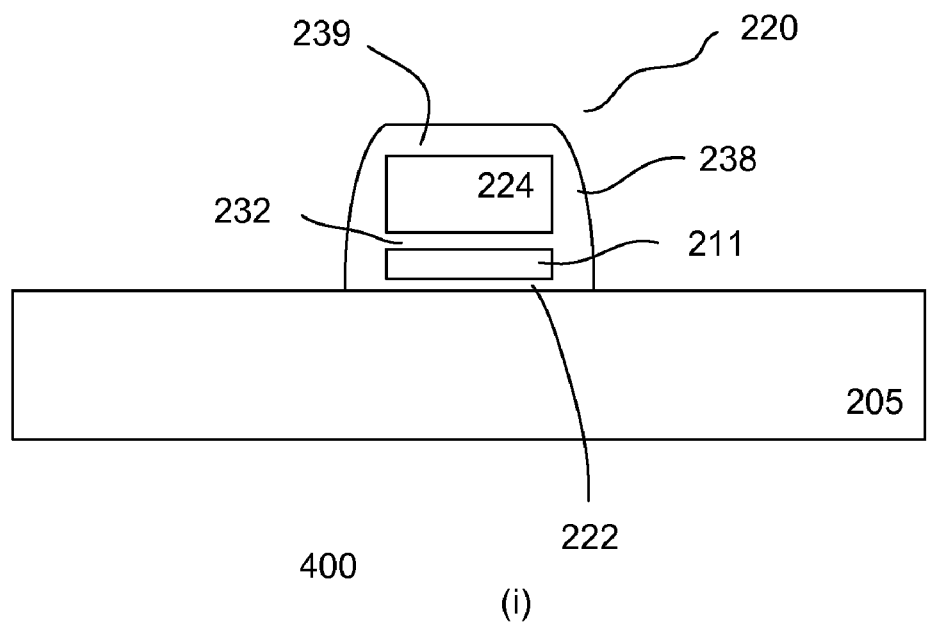
Figure 4B:
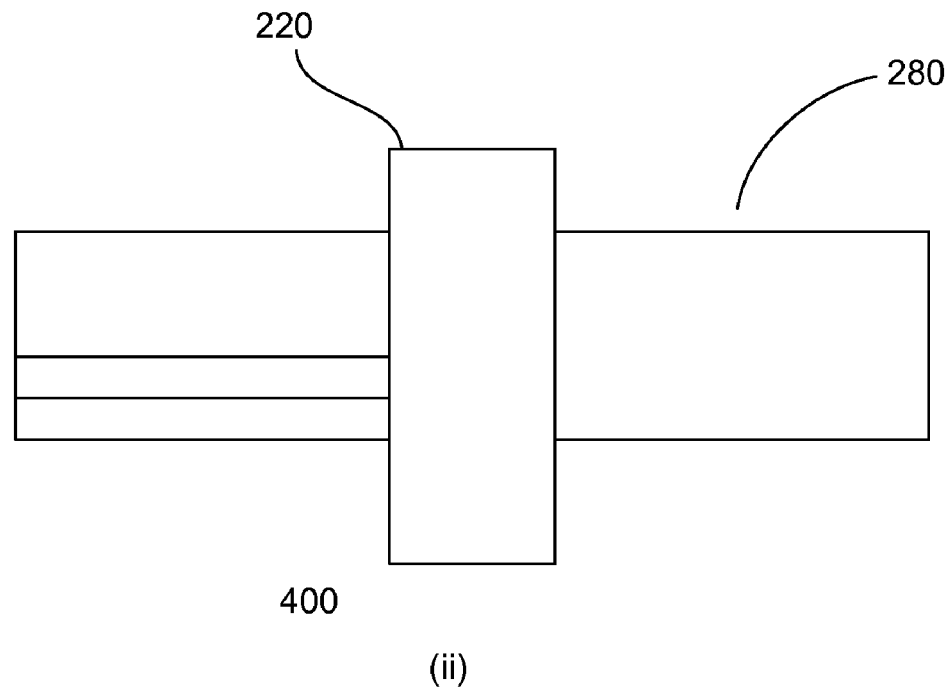

Referring to FIG. 4b, a gate stack 220 is formed on the substrate. The gate stack is formed over the active region. The gate is disposed on the substrate to divide the active region into first and second sections on each side of the gate. In one embodiment, the gate stack comprises a control gate electrode over a floating gate electrode. A first or tunneling dielectric layer 222 is disposed between the floating gate electrode and substrate and an inter-gate dielectric layer 232 is disposed between the gate electrodes. A dielectric cap 239 can be provided over the control gate electrode. Dielectric sidewall spacers 238 are disposed on the sides of the gate stack.

Forming the gate stack comprises, for example, forming the gate stack layers on the substrate. In one embodiment, a tunneling dielectric layer 222 is formed on the substrate. The tunneling dielectric layer, in one embodiment, comprises silicon oxide. Other types of gate dielectric layers, such as silicon oxynitride, may also be used. Various techniques, such as thermal oxidation or CVD, can be employed to form the second gate dielectric layer. The thickness of the tunneling dielectric layer may be about 10-100 Å. Other thicknesses are also useful.

On the tunneling dielectric layer is deposited a floating gate electrode layer. The floating gate electrode layer comprises, in one embodiment, polysilicon. The gate electrode layer can be formed as an amorphous or non-amorphous layer. The gate electrode may be doped. Various techniques may be employed to dope the gate electrode, for example, insitu doping or ion implantation. Providing an undoped gate electrode layer may also be useful. Other types of gate electrode materials are also useful. The thickness of the second gate electrode layer may be about 50 nm. Other thicknesses are also useful. To form the second gate electrode layer, techniques such as chemical vapor deposition (CVD), can be used. Other techniques are also useful.

An inter-gate dielectric and control gate electrode layers are then formed over the floating gate electrode layer. The inter-gate dielectric layer 232, for example, comprises silicon oxide having a thickness of about several nm. Other types of dielectric materials or thicknesses are also useful. As for the control gate electrode 224, it can be formed from polysilicon or other gate electrode materials. The thickness of the control gate electrode may be about 50 nm. Providing a control gate electrode having other thicknesses is also useful. A dielectric cap layer 239 can be formed over the control gate electrode. The cap layer, for example, comprises silicon nitride having a thickness of about 20 nm. Other types of cap materials or thicknesses are also useful. The layers can be formed using various techniques, such as CVD.

The layers of the gate stack are patterned to form the gate stack. Various techniques, such as masking and etching, can be used to pattern the gate stack. For example, a photoresist layer is formed over the gate stack layers and patterned, exposing portions of the gate stack layers. An anisotropic etch, such as a reactive ion etch (RIE), is performed to remove exposed portions of the gate stack layers. To improve lithographic resolution, an anti-reflective coating (ARC) can be provided beneath the photoresist.

After patterning the gate stack, the photoresist is removed. Sidewall spacers 238 are formed on the sidewalls of the gate stack. Forming the spacers, for example, comprises depositing a dielectric layer and anisotropically etching the layer to remove the horizontal portions. The vertical portions remaining form sidewall spacers.

Figure 4C:
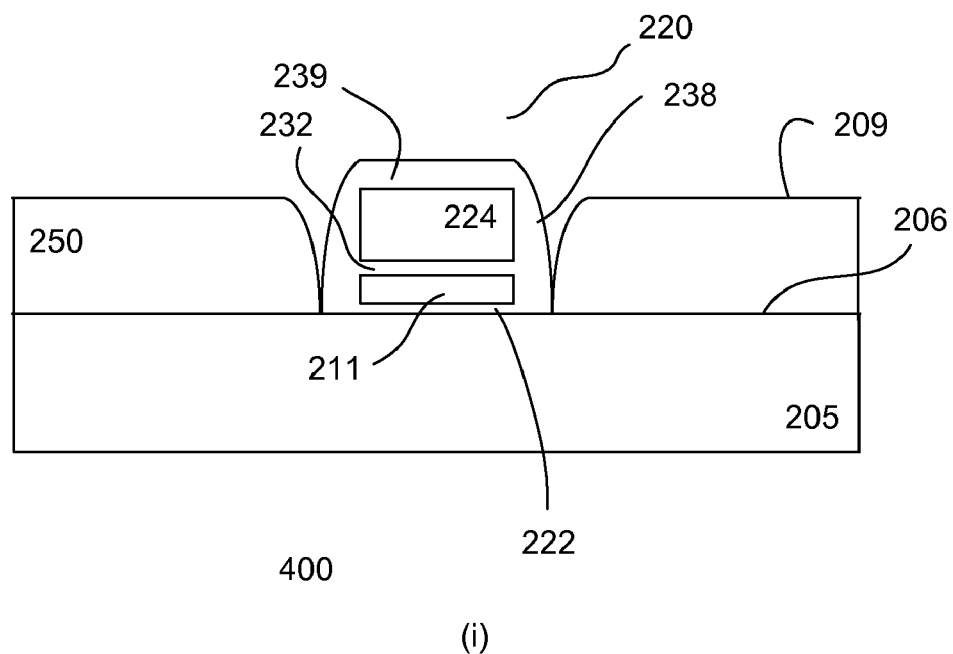
Figure 4C:
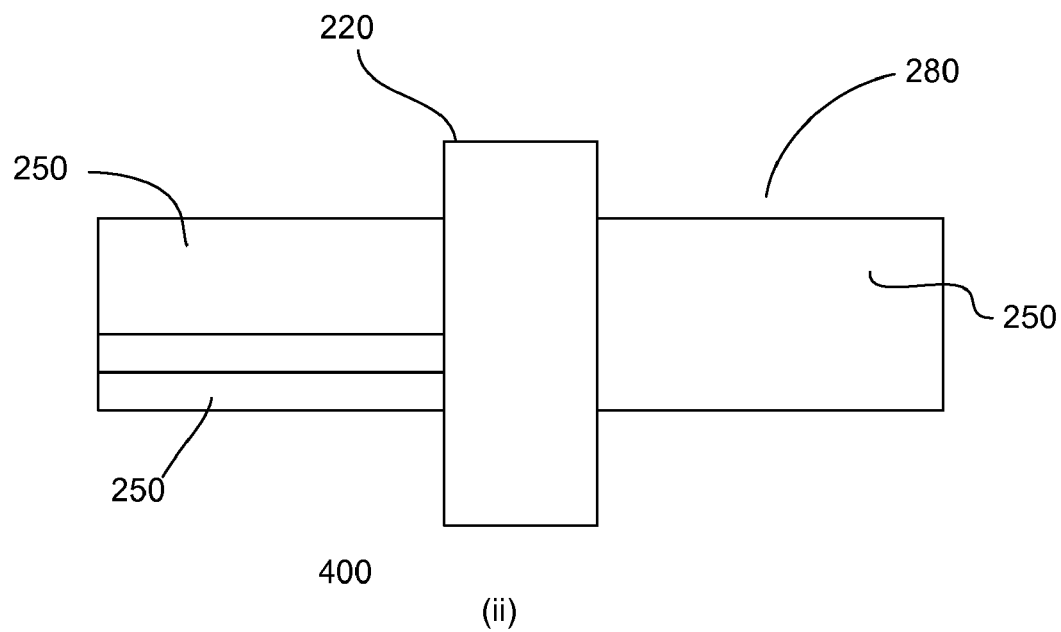

As shown in FIG. 4c, the process continues by forming raised regions 250 on the substrate in regions corresponding to the doped regions. The raised regions, in one embodiment, comprise crystalline regions. The raised regions, for example, comprise silicon or silicon germanium. Other types of crystalline material, such as Sn or InAs, may also be useful. In one embodiment, the raised regions are formed by chemical vapor epitaxy. Preferably, the raised regions are formed by selective chemical vapor epitaxy. By employing selective epitaxy, raised regions are formed only in the exposed portions of the underlying substrate, which corresponds to the doped regions. Other techniques to form the raised regions may also be useful. In one embodiment, the height of the raised regions is about 50 nm. Other heights are also useful.

The process continues by forming doped regions of the transistors. Since the transistor comprises both first and second polarity type doped regions, two implant processes are performed, one for the first type dopants and the other for the second type dopants. The dopants are selectively implanted into the doped regions using an implant mask. The implant mask, for example, comprises a patterned photoresist layer exposing regions to be implanted with dopants.

Figure 4D:
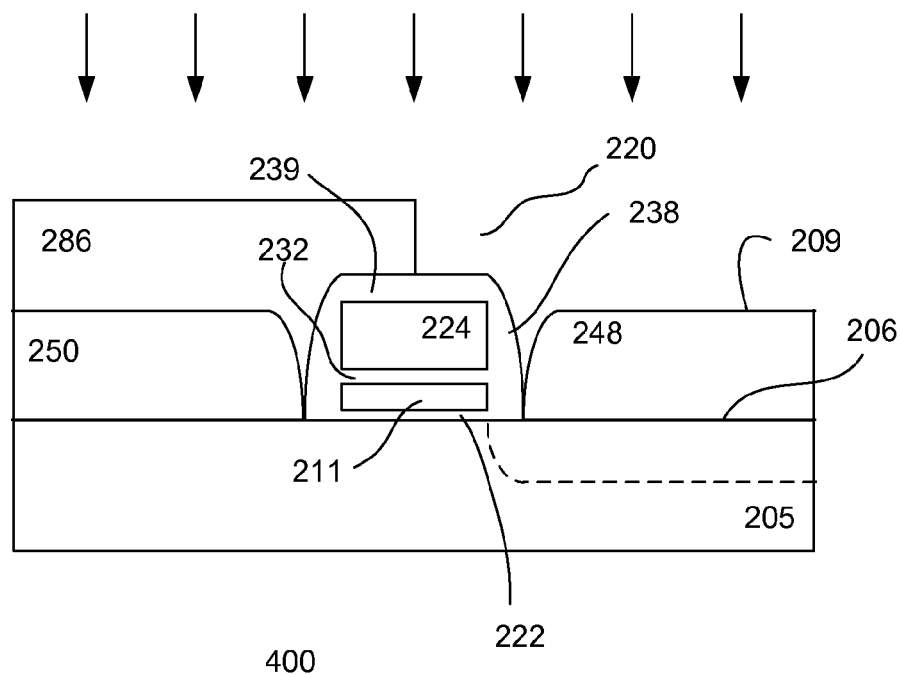
Figure 4D:
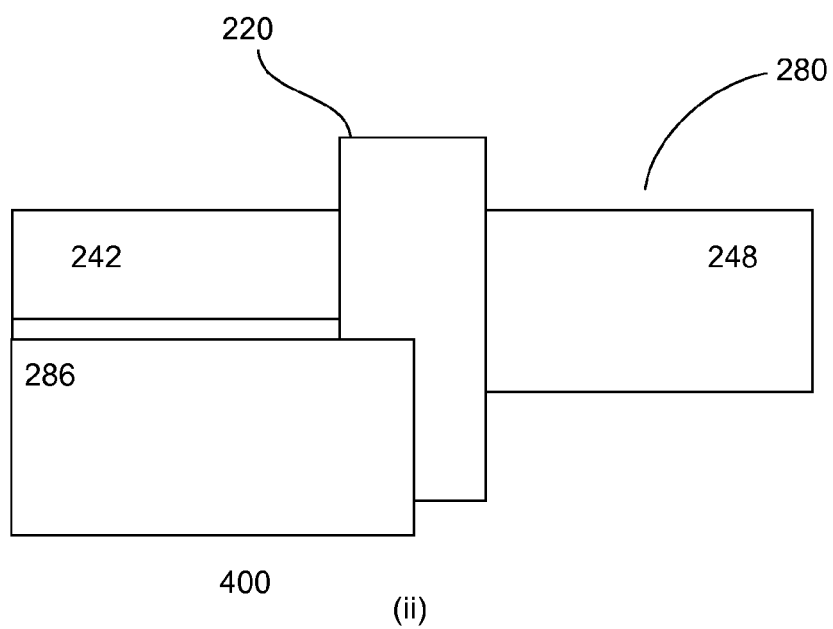

FIG. 4d shows the substrate implanted with dopants to form doped regions of one of the first or second polarity type. As shown, the process forms doped regions with dopants of the second polarity type. In one embodiment, a first implant mask 286 is formed on the substrate and patterned to expose the first source region 242 and drain region 248. Second type dopants, such as n-type dopants, are implanted into the substrate, forming second type doped regions corresponding to the first source and drain regions. The doped regions, for example, occupy the raised regions and extend below the surface of the substrate.

Figure 4E:
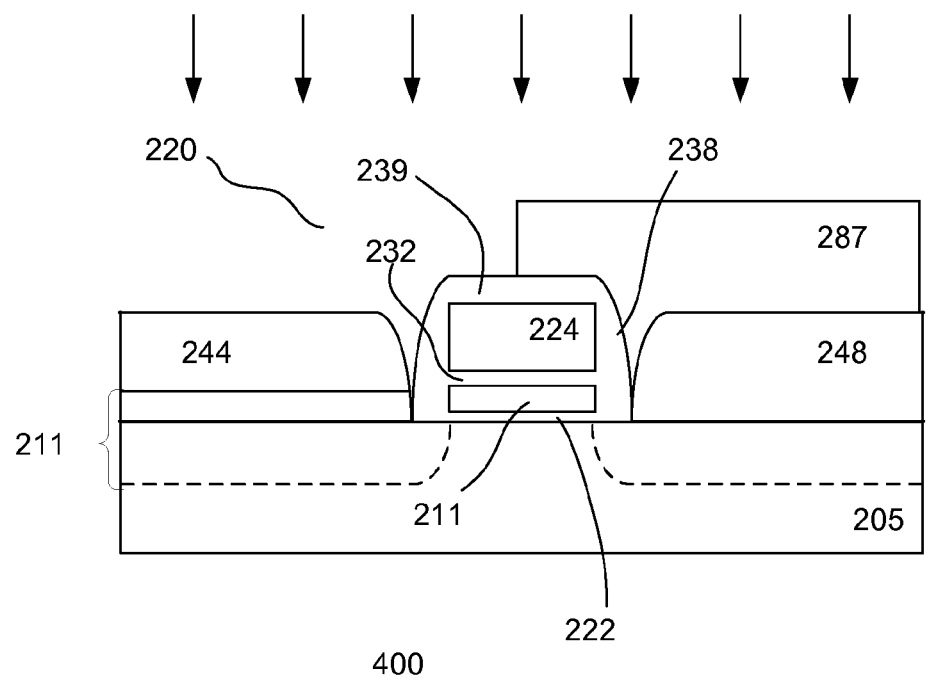
Figure 4E:
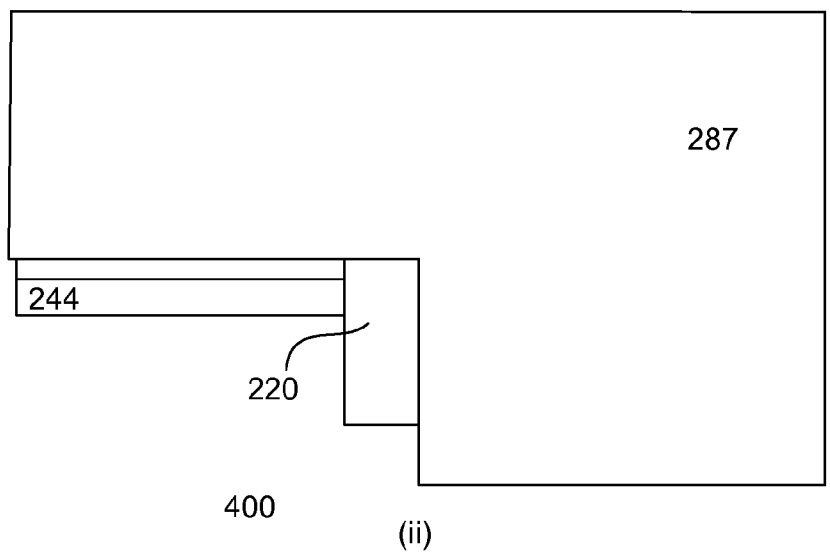

FIG. 4e shows the substrate implanted with dopants to form doped regions of the other of the first or second polarity type. As shown, the process forms doped regions with dopants of the first polarity type. In one embodiment, a second implant mask 287 is formed on the substrate and patterned to expose the second source region 244. First type dopants, such as p-type dopants, are implanted into the substrate, forming the first type doped region corresponding to the second source region.

In one embodiment, the first type dopants are implanted into an upper portion of the raised region to form a second source region which occupies the upper portion of the raised region. The lower portion of the raised region and substrate form an I-region 211. The I-region extends along the substrate below the spacer.

Figure 4F:
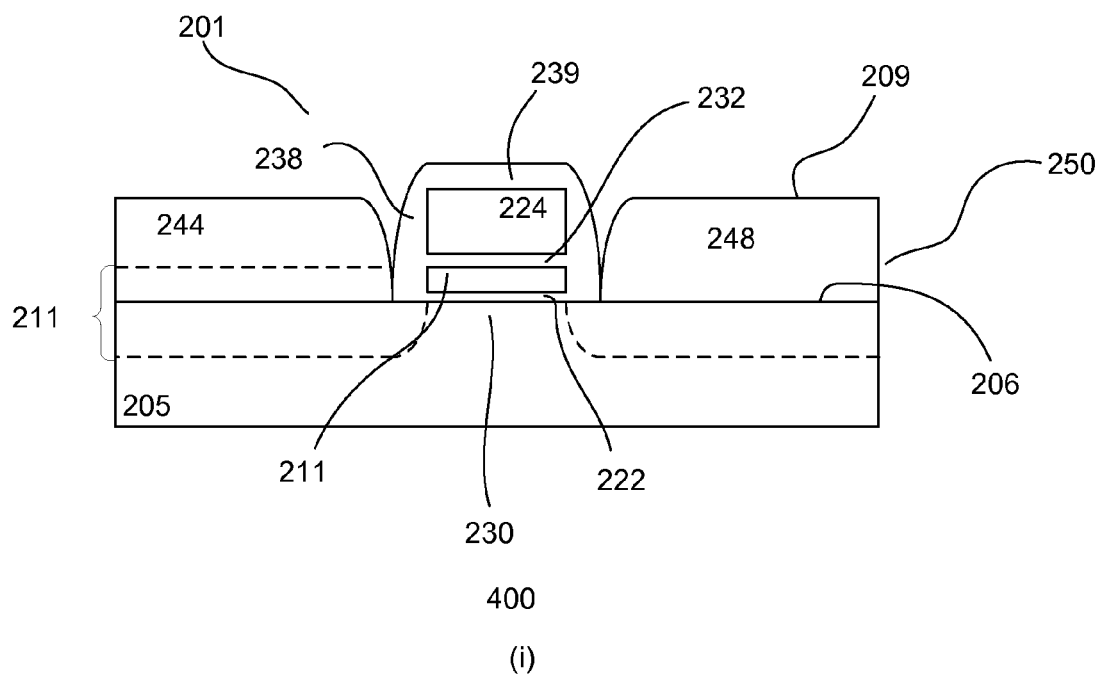
Figure 4F:
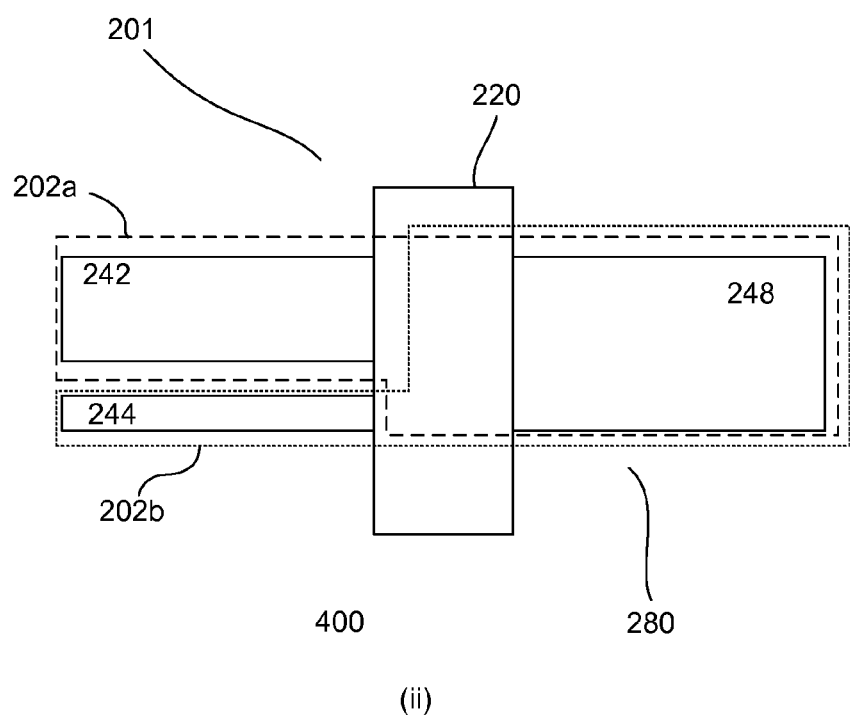

FIG. 4f shows the transistor after removal of the second implant mask. The process continues to complete the formation of the device.

In alternative embodiments, a raised region is provided for only the second source region of the transistor. Other configurations of raised regions for the transistors may also be useful. In yet other embodiments, no raised regions are provided for the transistor. In such cases, the I-region is disposed between the source and gate in the substrate.

Figure 5A:
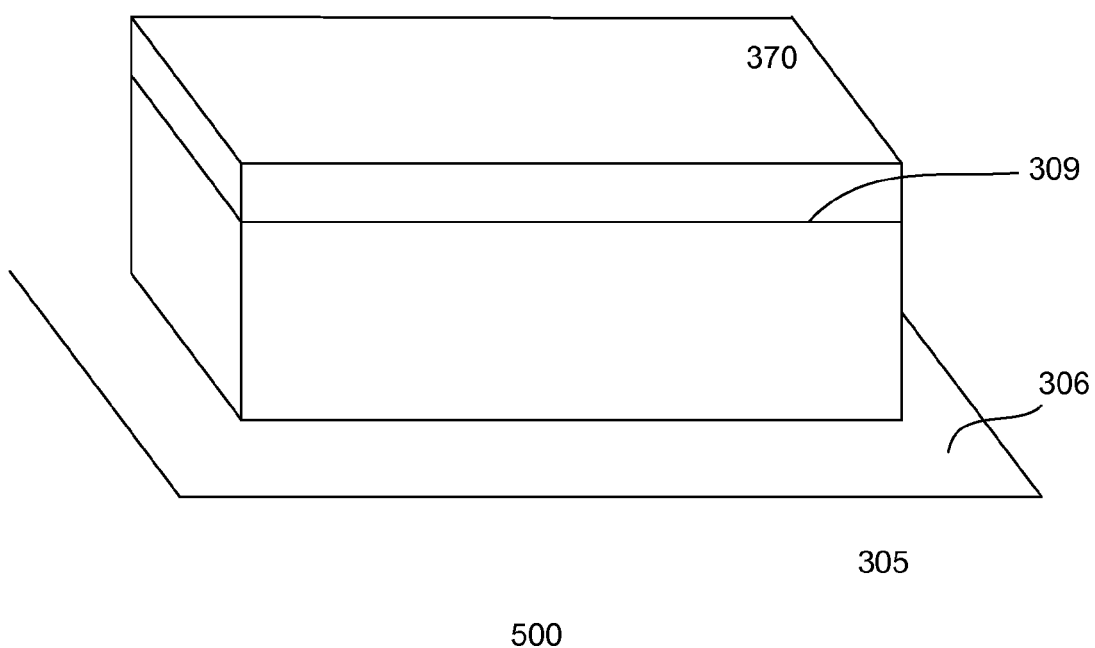
FIGS. 5a-g show another embodiment of a process for forming a device.

FIGS. 5a-g show 3-dimensional view of another embodiment of a process for forming a portion 500 of a device or IC. Referring to FIG. 5a, a substrate 305 is provided. The substrate, for example, comprises a COI substrate. A COI substrate, for example, includes a bulk crystalline substrate and a surface crystalline layer separated by a buried oxide layer. The COI substrate, in one embodiment, comprises a SOI substrate which includes a silicon surface crystalline layer. Other types of COI substrates, such as a SiGe-on-insulator substrate which includes a SiGe surface crystalline layer, may also be used.

The substrate is prepared with an active region. The active region serves as a region on which a transistor is formed. The active region, in one embodiment, comprises an undoped crystalline island disposed on the buried oxide layer. The island, for example, serves as an elevated body of a transistor, as described in FIGS. 1 and 3a-b. The transistor can be a memory cell in an array region of the device. In one embodiment, the memory cells comprise non-volatile memory cells. Other types of memory cells are also useful. The array region generally comprises a plurality of active regions for a plurality of memory cells.

Additionally, the substrate may include a logic portion (not shown) for support circuitry. The substrate may also include regions for other types of circuitry, depending on the type of device or IC.

The elevated body is formed by, for example, patterning the surface crystalline layer of the COI substrate. To pattern the surface crystalline layer, a hard mask 370 can be used. For example, the hard mask is formed on a surface 309 of the COI substrate. The hard mask, for example, comprises silicon oxide. Other types of hard mask materials, such as silicon nitride, may also be useful. Preferably, the hard mask comprises a dielectric material.

In one embodiment, the hard mask layer is patterned using a patterned soft mask, such as photoresist. Using the soft mask, the hard mask is patterned to expose unwanted portions of the surface crystalline layer. The soft mask may be removed after patterning the hard mask. An anisotropic etch, such as reactive ion etch (RIE) is performed to remove the exposed portions of the surface crystalline layer to expose portions of the buried oxide layer 306 below. The portion of the surface crystalline layer which is protected by the hard mask remains, forming an elevated body of the transistor on the buried oxide layer.

The material of the elevated body depends on the type of COI substrate used. For example, the elevated body comprises silicon for a SOI substrate or silicon germanium for a SiGe on insulator substrate. Other types of crystalline material, such as germanium tin or indium arsenide, may also be useful. In one embodiment, the height of the body is about 50 nm. Other thicknesses may also be useful. The height may, for example, depend on the thickness of the surface crystalline layer of the COI substrate.

Figure 5B:
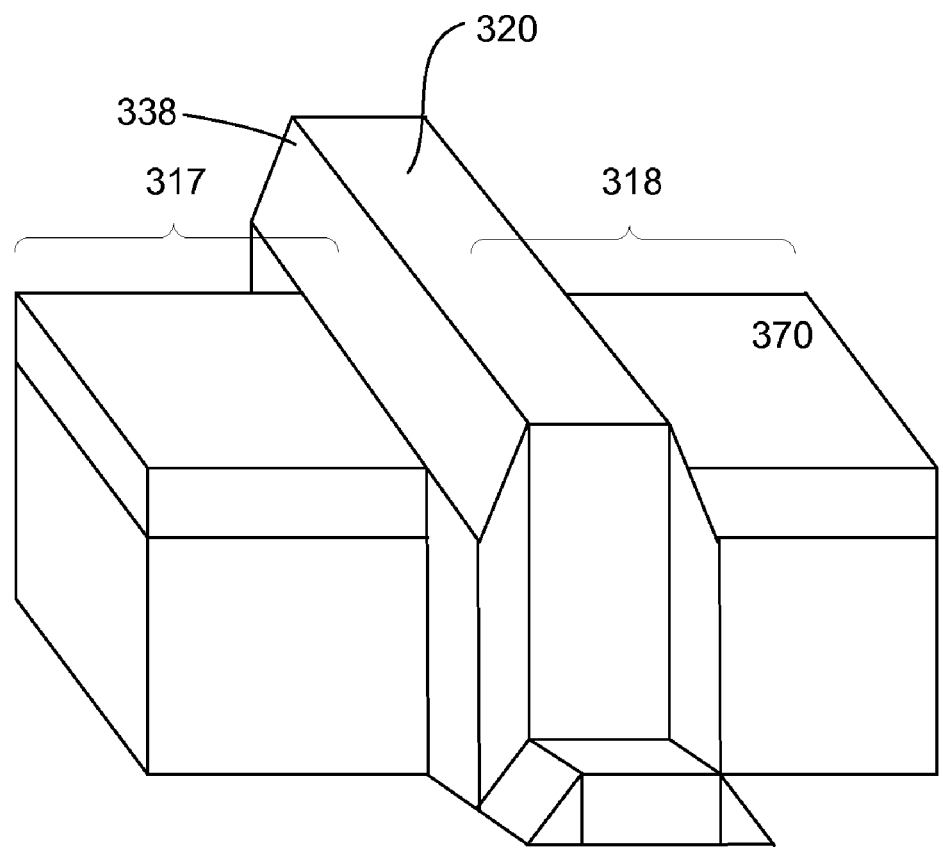

Referring to FIG. 5b, a gate stack 320 is formed on the substrate. The gate, for example, wraps around the body portion, separating the body portion into first and second sections 317 and 318. As shown, the gate wraps around about a mid-section of the body portion, forming sections of about the same size. Forming sections having different sizes is also useful.

The gate stack, in one embodiment, comprises a floating and control gate electrodes in which a tunneling dielectric layer separates the floating gate electrode from the body portion and an inter-gate dielectric layer separating the gate electrodes. A dielectric cap layer may be disposed on top of the gate stack. The gate stack can be formed in a similar manner as described in FIG. 2b. For example, the various layers of the gate are patterned to form the gate stack. Forming other types of gate stacks or employing other techniques to form the gate stack is also useful.

After patterning the gate stack, the photoresist is removed. Sidewall spacers 338 are formed on the sidewalls of the gate stack. Forming the spacers, for example, comprises depositing a dielectric layer and anisotropically etching the layer to remove the horizontal portions. The vertical portions remaining form sidewall spacers.

The process continues by forming doped regions of the transistor. In one embodiment, a first type doped region which serves as the second source region is formed. Since the transistor comprises both first and second polarity type doped regions, the different types of doped regions are processed separately.

Figure 5C:
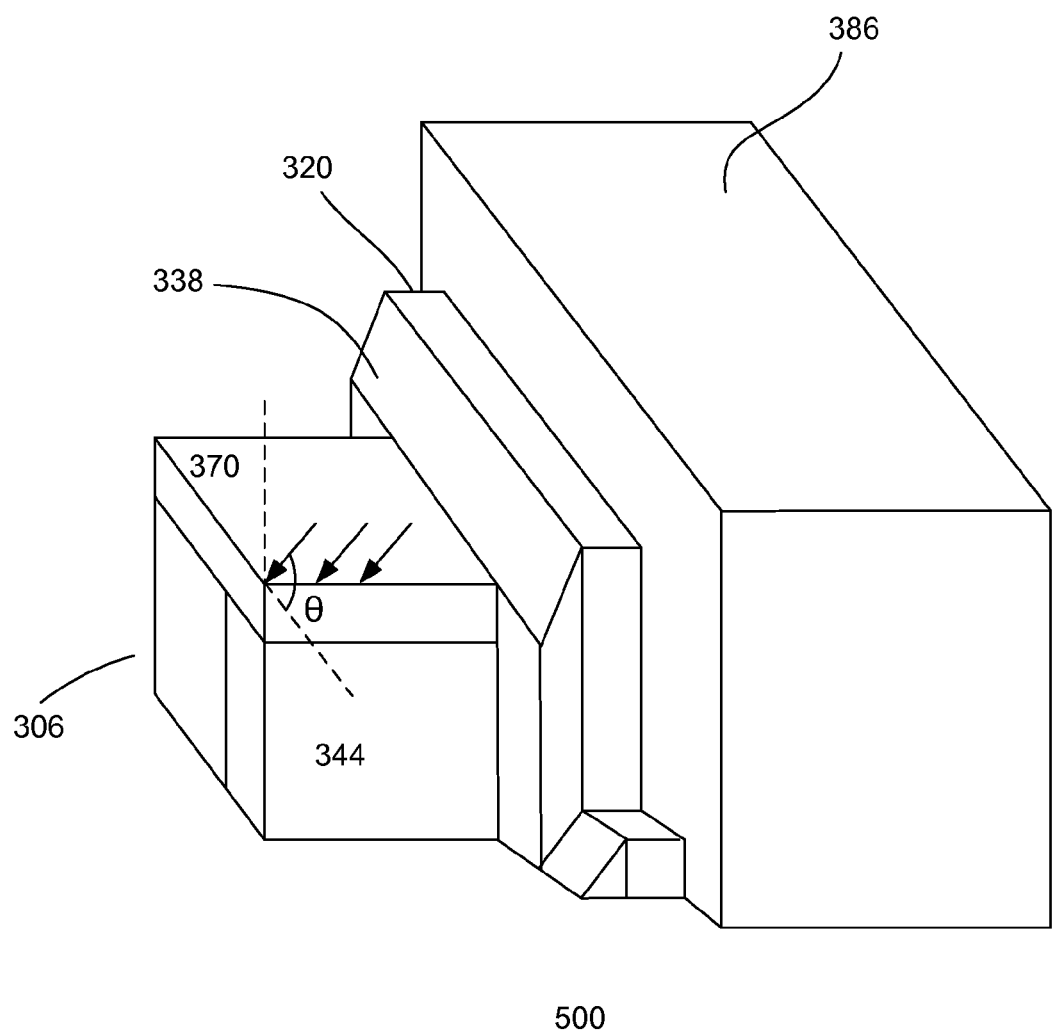

Referring to FIG. 5c, first type polarity doped regions are formed. For example, the second source region of the second sub-transistor with an I-region is formed. A first implant mask 386 is formed on the substrate. The first implant mask protects the second section 318 from being processed. The implant mask, as shown, covers a second side of the gate stack and the second section of the body portion. First type dopants are implanted into the substrate to a form first type doped region 344. For example, p-type dopants are implanted to form a p-type second source region.

In one embodiment, the implant comprises an angled or tilted implant. The lateral component of the angled implant is in the direction perpendicular to and towards the side (implant side) which the second source 344 is located. The lateral component may be referred to as the twist angle. In one embodiment, the twist angle is about 0°, while the vertical component of the angled implant does not penetrate the hard mask. Performing the angled implant with a twist angle of about 0° results in an I-region under the spacer. Other twist angles that enable the formation of an I-region under the spacers may also be useful. The tilt angle θ is the angle at which the dopants are implanted into the side of the body relative to the plane of the substrate. In one embodiment, the tilt angle θ is about 30° to 60°. Implanting dopants at other tilt angles may also be useful. The hard mask protects the opposing side and top of the body from being implanted with dopants.

Figure 5D:
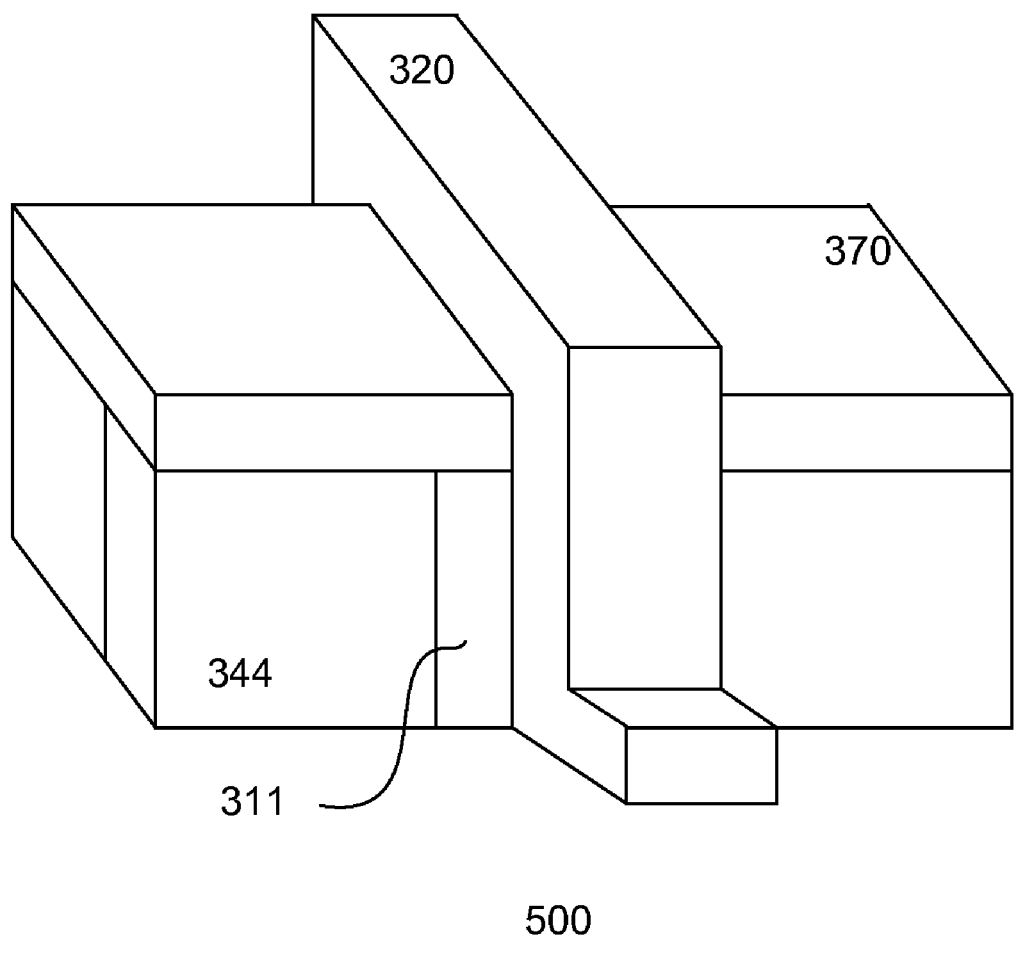

Referring to FIG. 5d, the first implant mask 386 is removed. The mask can be removed by ashing. Other techniques for removing the mask are also useful. After removal of the mask, the spacers on the sidewalls of the gate stack are removed. For example, a wet etch selective to silicon can be employed to remove the spacers. Removal of the spacers exposes the I-region 311 between the second source 344 and the gate 320. The spacer protects the I-region from being doped during the implant to form the second source region.

The process continues by forming the second polarity type doped regions in the body of the transistor. For example, the process continues to form n-type doped regions. In one embodiment, forming the second polarity type doped regions comprises multiple implant processes.

Figure 5E:
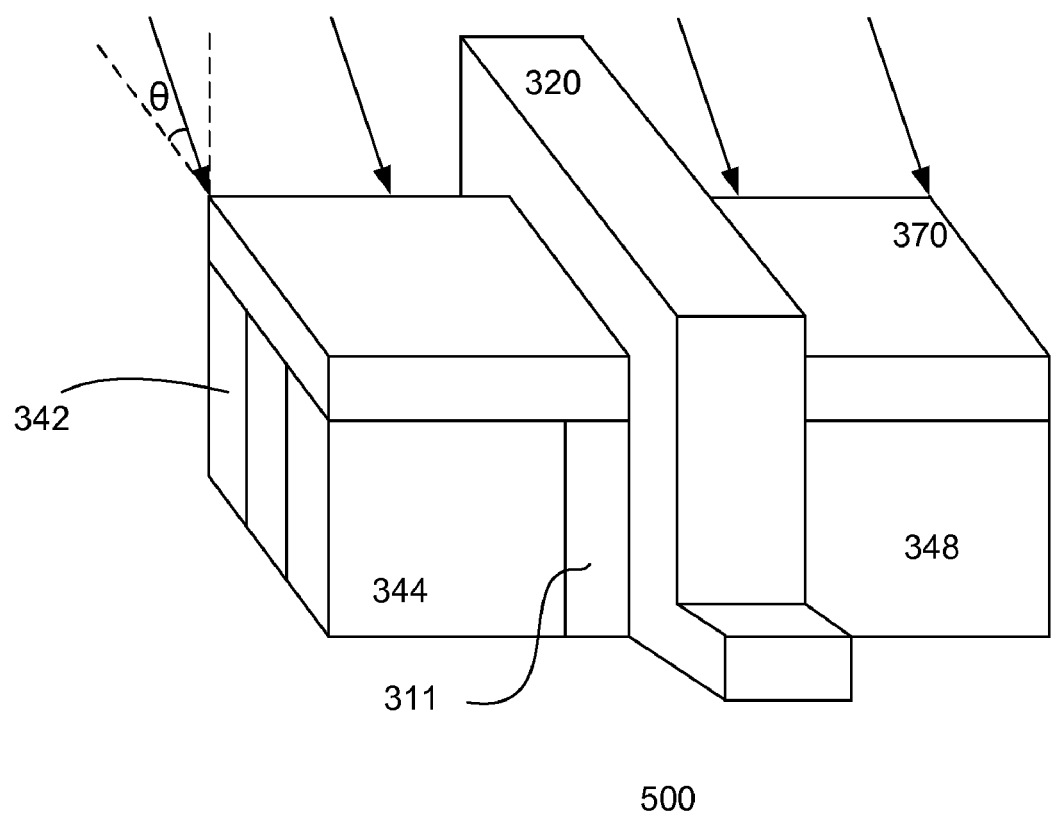

As shown in FIG. 5e, a first angled implant of second polarity type dopants is performed to form the first source region 342 and partially the drain region 348. The angled implant, in one embodiment, is twisted about 180° from the angled implant used to form the second source region 344. In one embodiment, the lateral component is controlled such that an undoped mesa isolation region 312 is formed between the first and second doped regions. On the other hand, the vertical component does not penetrate the top hard mask. The energy of the angled implants should be well controlled for the formation of the undoped mesa isolation region 312. The tilt angle θ of the first source implant, for example, is about 45°. Other tilt angles may also be useful.

Figure 5F:
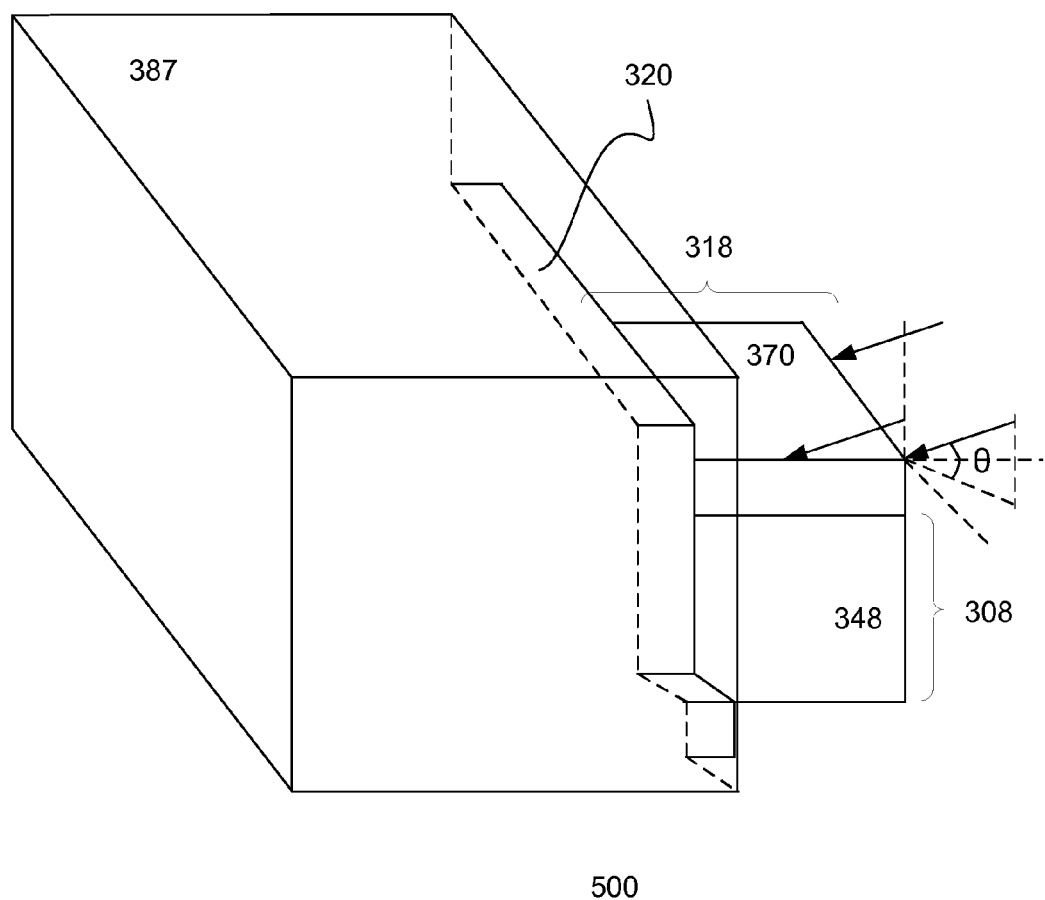

Referring to FIG. 5f, the process continues to complete forming the drain region 348. In one embodiment, a second implant mask 387 is formed on the substrate to protect the first section 317 from being processed. The implant mask, as shown, covers a first side of the gate stack and the first section of the body portion. Second type dopants are implanted into the substrate to complete the formation of the drain region 348.

In one embodiment, a second implant of second type dopants is performed. The second implant comprises an angled implant twisted about 180° with respect to the first angled implant which formed the first source (e.g., a twist angle of about 0°). The tilt angle $θ_2$ of the second implant of second polarity type dopants, in one embodiment, is about 30° to 60°. Providing other tilt angles may also be useful. The range of the tilt angle of the second implant is determined such that its vertical component does not penetrate the top hard mask and its lateral component does not merge with the first doped regions. The second implant forms a portion of the drain adjacent to the side of the drain formed during formation of the first source.

In one embodiment, a third implant of the second polarity type dopants is performed. The third implant comprises an angled implant twisted about 135° clockwise with respect to the second angled implant of the second polarity type dopants. The angle $θ_3$ of the third implant of second polarity type dopants, for example, is about 30° to 60°. Other tilt angles may also be useful. The range of the tilt angle of the third implant is determined such that its vertical component does not penetrate the top hard mask. The third implant connects the drains from the opposing sides of the second section of the body portion, completing the formation of the drain region of the transistor.

Figure 5G:
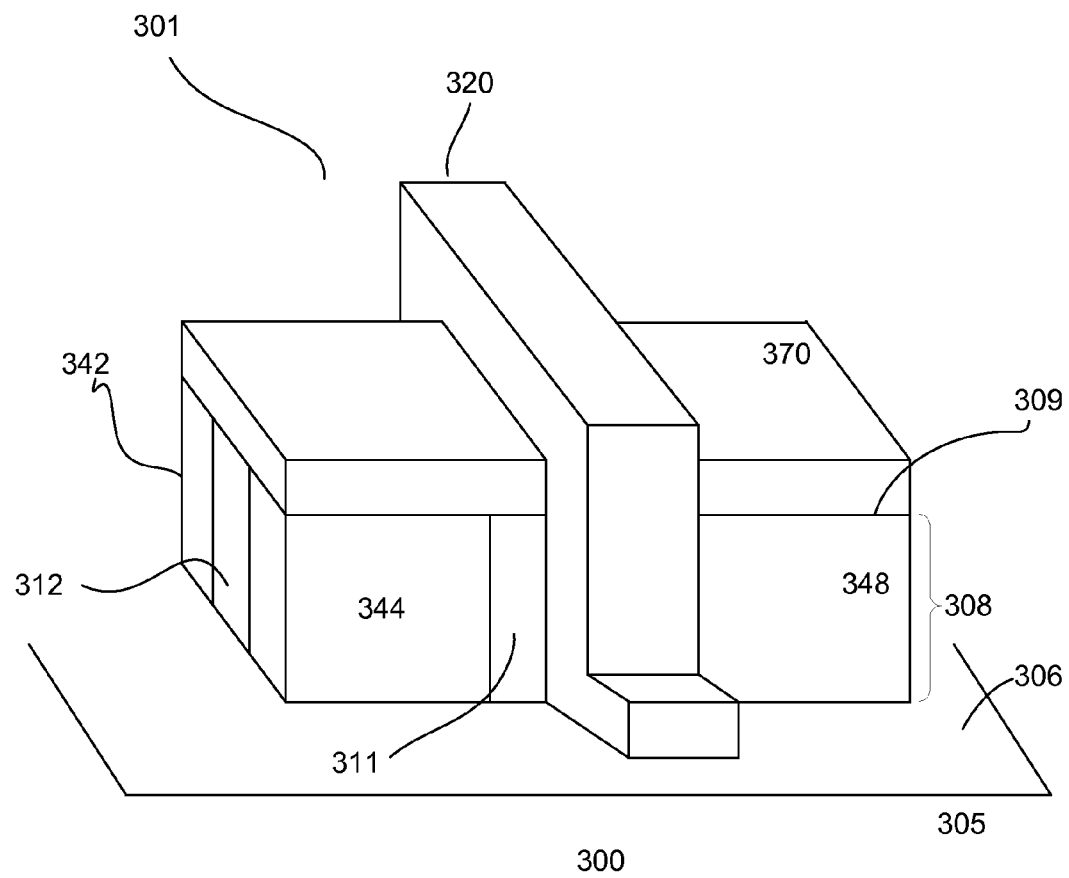

FIG. 5g shows the transistor after removal of the second implant mask. The process continues to complete the formation of the device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A device comprising:
   a memory cell having a hybrid transistor, wherein the transistor includes
   a substrate having an active area,
   a gate on the substrate, and first and second current paths through the gate, wherein the first current path serves a first purpose and the second current path serves a second purpose, the current paths are selected by providing an appropriate signal at the gate.

2. The device of claim 1 wherein the transistor comprises:
first and second source regions adjacent to a first side of the gate; and
a drain region adjacent to a second side of the gate.

3. The device of claim 2 wherein the transistor comprises an ionization region disposed between the second source region and the gate.

4. The device of claim 2 wherein the transistor comprises at least four terminals, wherein the first and second terminals are coupled to first and second source regions, the third terminal is coupled to a drain region, and the fourth terminal is coupled to the gate.

5. The device of claim 4 wherein:
the first current path is used for programming the memory cell; and
the second current path is used for reading the memory cell.

6. The device of claim 5 wherein:
the first current path is formed through the first, fourth and the third terminal; and
the second current path is formed through the second, fourth and the third terminal.

7. The device of claim 1 wherein the transistor includes:
a first sub-transistor comprising a transistor having first source and drain regions comprising dopants of the same polarity type; and
a second sub-transistor comprising an impact ionization transistor having second source and drain regions comprising dopants of the opposite polarity types.

8. The device of claim 7 wherein the impact ionization transistor comprises a P-I-N diode including an intrinsic region between doped regions of first and second polarity types.

9. The device of claim 7 wherein the gate comprises first and second sub-gate electrodes.

10. The device of claim 9 wherein:
the first sub-gate electrode serves as a control gate; and
the second sub-gate electrode serves as a floating gate.

11. The device of claim 7 wherein the second source region comprises an elevated doped region in an upper portion of a raised region.

12. A method of forming a device comprising:
forming a memory cell having a hybrid transistor, wherein forming the memory cell includes
providing a substrate having an active area,
forming a gate on the substrate, and
forming first and second current paths through the gate, the first current path serves a first purpose and the second current path serves a second purpose, wherein the gate controls selection of the current paths.

13. The method of claim 12 wherein the transistor comprises:
first and second source regions adjacent to a first side of the gate; and
a drain region adjacent to a second side of the gate.

14. The method of claim 13 wherein the transistor comprises an ionization region disposed between the second source region and the gate.

15. The method of claim 13 wherein the substrate comprises a crystalline-on-insulator substrate.

16. The method of claim 15 wherein the transistor comprises a FinFET.

17. The method of claim 16 wherein the transistor comprises an elevated body disposed on a buried oxide layer of the substrate, the body portion is wrapped around by the gate and separated into first and second sections.

18. The method of claim 17 comprises forming sidewall spacers on sidewalls of the gate.

19. The method of claim 18 comprises:
performing a angled implant of first polarity type dopants into the substrate, forming the second source region and an intrinsic region beneath the spacers;
performing a first angled implant of second polarity type dopants into the substrate, forming the first source region and partially the drain region; and
performing a further plurality of angled implants of second polarity type dopants into the substrate, completing the formation of the drain region.

20. The method of claim 12 wherein the transistor comprises at least four terminals, wherein the first and second terminals are coupled to first and second source regions, the third terminal is coupled to a drain region, and the fourth terminal is coupled to the gate.

21. The method of claim 20 wherein:
the first current path is formed through the first, fourth and the third terminal; and
the second current path is formed through the second, fourth and the third terminal.

22. The method of claim 12 wherein:
the first current path is used for programming the memory cell; and
the second current path is used for reading the memory cell.

23. The method of claim 12 wherein the transistor includes:
a first sub-transistor comprising a transistor having first source and drain regions comprising dopants of the same polarity type; and
a second sub-transistor comprising an impact ionization transistor having second source and drain regions comprising dopants of the opposite polarity types.

24. The method of claim 23 wherein the impact ionization transistor comprises a P-I-N diode including an intrinsic region between doped regions of first and second polarity types.

25. The method of claim 23 wherein the gate comprises first and second sub-gate electrodes.

26. The method of claim 25 wherein:
the first sub-gate electrode serves as a control gate; and
the second sub-gate electrode serves as a floating gate.

27. The method of claim 23 wherein the second source region comprises an elevated doped region in an upper portion of a raised region.

28. The method of claim 27 comprises:
performing a first implant to implant second type dopants into the substrate, forming the first source and drain regions; and
performing a second implant to implant first type dopants into the substrate, forming the second source region.

29. The method of claim 28 wherein the intrinsic region comprises an lower portion of the raised region and substrate.

30. A method of forming an integrated circuit comprising:
forming a memory cell having a hybrid transistor, wherein forming the memory cell includes
providing a substrate having an active area,
forming a gate on the substrate, and
forming first and second current paths through the gate, the first current path serves a first purpose and the second current path serves a second purpose, wherein the gate controls selection of the current paths.

* * * * *